US009129773B2

(12) United States Patent
Ando et al.

(10) Patent No.: US 9,129,773 B2
(45) Date of Patent: Sep. 8, 2015

(54) CHARGED PARTICLE BEAM APPARATUS

(71) Applicant: Hitachi High-Technologies Corporation, Minato-ku, Tokyo (JP)

(72) Inventors: Tohru Ando, Tokyo (JP); Kunji Shigeto, Tokyo (JP); Shotaro Tamayama, Tokyo (JP); Yusuke Narita, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/406,415

(22) PCT Filed: Jun. 3, 2013

(86) PCT No.: PCT/JP2013/065312
§ 371 (c)(1),
(2) Date: Dec. 8, 2014

(87) PCT Pub. No.: WO2013/183573
PCT Pub. Date: Dec. 12, 2013

(65) Prior Publication Data
US 2015/0144804 A1 May 28, 2015

(30) Foreign Application Priority Data
Jun. 8, 2012 (JP) ................. 2012-130355

(51) Int. Cl.
*H01J 3/14* (2006.01)
*H01J 37/20* (2006.01)
(Continued)

(52) U.S. Cl.
CPC ................. *H01J 37/20* (2013.01); *H01J 37/22* (2013.01); *H01J 37/261* (2013.01); *H01J 37/28* (2013.01);
(Continued)

(58) Field of Classification Search
CPC .................... B23K 15/0013; H01J 2237/3114; H01J 2237/31745
USPC .......... 250/423 R, 310, 306, 311, 396 R, 398, 250/492.1, 492.3
See application file for complete search history.

(56) References Cited

U.S. PATENT DOCUMENTS

2002/0079463 A1* 6/2002 Shichi et al. ................ 250/492.1
2009/0184256 A1* 7/2009 Shigeto et al. ............ 250/396 R
(Continued)

FOREIGN PATENT DOCUMENTS

JP 59-41967 U 3/1984
JP 3-37946 A 2/1991
(Continued)

OTHER PUBLICATIONS

International Search Report (PCT/ISA/210) dated Sep. 10, 2013 with English-language translation (Eight (8) pages).

*Primary Examiner* — Nikita Wells
(74) *Attorney, Agent, or Firm* — Crowell & Moring LLP

(57) ABSTRACT

In many cases, the charged particle beam apparatus is used basically for observation at a magnification of 10,000 times or higher. It is thus difficult to recognize how the orientation of a sample seen with the naked eye corresponds to the origination of the sample appearing on an acquired image. This makes it difficult intuitively to grasp the tilt direction and other details of the sample. An object of this invention is to provide a charged particle beam apparatus allowing the orientation and the tilted state of the sample to be grasped intuitively. The apparatus includes: a charged particle beam source that emits a charged particle beam; a charged particle beam optical system that irradiates the sample with the charged particle beam; a platform on which the sample is placed; a stage capable of moving the platform at least in a tilt direction; a display unit that displays a tilted state of the platform by use of a simulated image of the platform; an operation input unit that allows a user to designate the position and direction of the sample for observation; and a control unit that controls the amount of movement of the stage based on a signal input from the operation input unit.

19 Claims, 7 Drawing Sheets

(51) Int. Cl.
*H01J 37/28* (2006.01)
*H01J 37/26* (2006.01)
*H01J 37/22* (2006.01)

(52) U.S. Cl.
CPC .... *H01J 2237/202* (2013.01); *H01J 2237/2007* (2013.01); *H01J 2237/2801* (2013.01); *H01J 2237/2809* (2013.01)

(56) References Cited

U.S. PATENT DOCUMENTS

| | | |
|---|---|---|
| 2010/0171037 A1 | 7/2010 | Bierhoff et al. |
| 2014/0226003 A1* | 8/2014 | Phaneuf et al. ............ 348/80 |
| 2015/0074523 A1* | 3/2015 | Konishi et al. ............ 715/705 |

FOREIGN PATENT DOCUMENTS

| | | |
|---|---|---|
| JP | 5-144399 A | 6/1993 |
| JP | 9-231934 A | 9/1997 |
| JP | 9-259805 A | 10/1997 |
| JP | 10-3875 A | 1/1998 |
| JP | 10-83782 A | 3/1998 |
| JP | 2001-84941 A | 3/2001 |
| JP | 2006-78424 A | 3/2006 |
| JP | 2009-540511 A | 11/2009 |
| JP | 2010-198998 A | 9/2010 |
| JP | 2012-138219 A | 7/2012 |

* cited by examiner

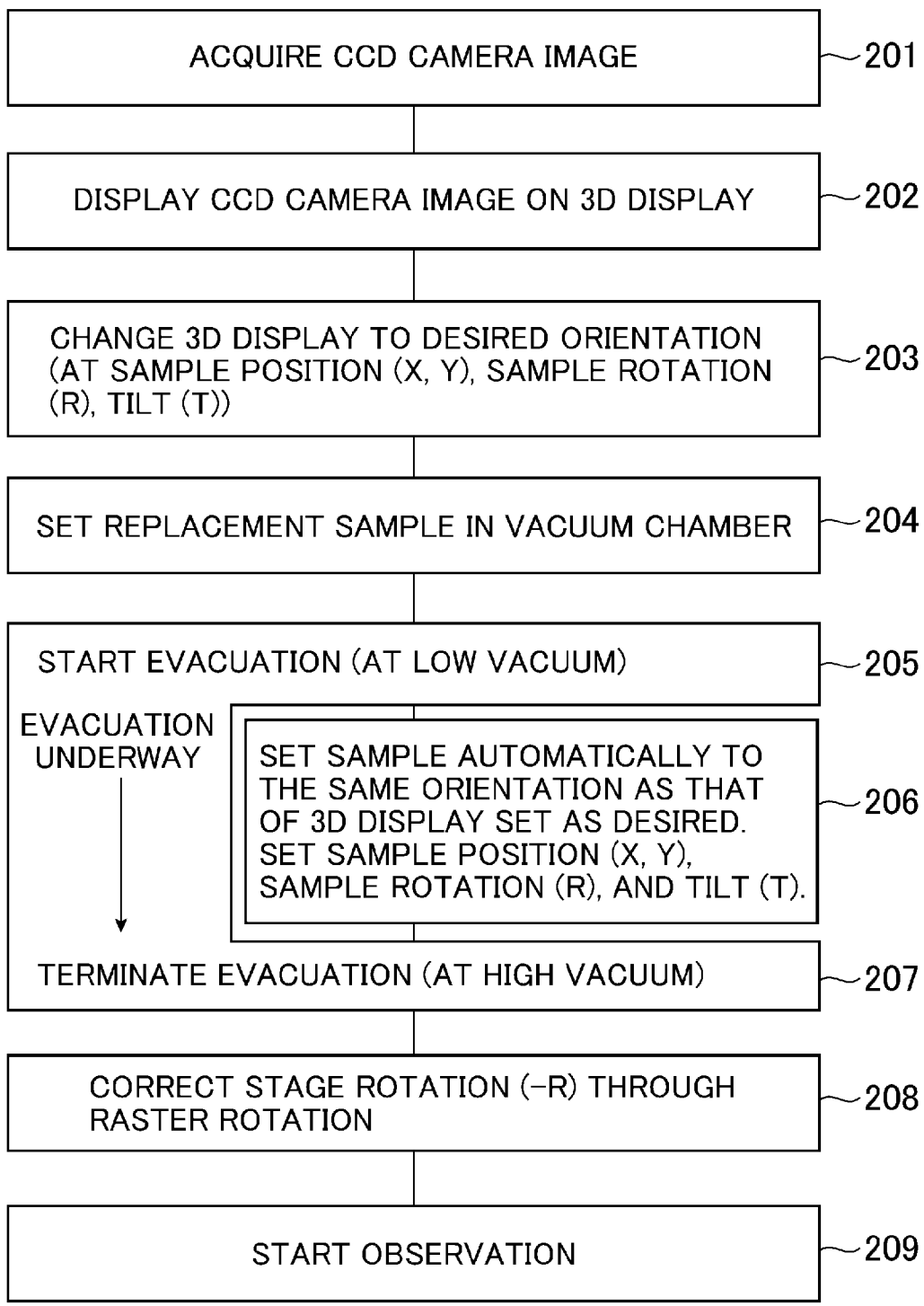

CCD CAMERA

IMAGE AS SEEN WITHOUT TILT (T)

IMAGE AS SEEN ON APPARATUS

IMAGE AS SEEN IDEALLY

IMAGE AS SEEN ON APPARATUS + DETECTOR POSITION

IMAGE AS SEEN IDEALLY + DETECTOR POSITION

IMAGE AS SEEN IDEALLY + APERTURE

3D REPRESENTATION

CHARGED PARTICLE BEAM APPARATUS

TECHNICAL FIELD

The present invention relates to a charged particle beam apparatus such as a scanning electron microscope.

BACKGROUND ART

The charged particle beam apparatus such as scanning electron microscopes obtains a high-magnification image of a sample by irradiating the sample with a charged particle beam to detect secondary particles such as secondary electrons or reflection electrons and by associating detected signals with the positions irradiated with the charged particle beam.

In recent years, fine samples have often been observed in tilted relation to the charged particle beam. For example, tilted observation is effective when: (1) it is desired to observe a tilted surface of the sample by irradiating that surface perpendicularly with the charged particle beam; (2) it is desired to view the sample three-dimensionally; (3) the characteristics of a crystal are changed when its direction or inclination is varied; (4) different characteristics are obtained depending on the reflection angle of charged particles; or (5) it is desired to minimize absorption of charged particles by the sample and alleviate charge-up for better viewing. As will be appreciated from the above, it has become important to observe fine samples in a state tilted at a precise angle.

Patent Document 1 describes an electron microscope that has an imaging device for obtaining a sample stage image. The sample stage image acquired by the imaging device is used on the display device to display information about the position of the sample on the sample stage where the sample image has been obtained.

PRIOR ART DOCUMENT

Patent Document

Patent Document 1
JP-2010-198998-A

SUMMARY OF THE INVENTION

Problem to be Solved by the Invention

In many cases, the above-mentioned charged particle beam apparatus is used basically for observation at a magnification of 10,000 times or higher. In such cases, it is difficult to recognize how the orientation of the sample seen with the naked eye corresponds to the origination of the sample appearing in the acquired image. The apparatus of the above-cited Patent Document 1 offers information only about the positions observed within a plane. It has been difficult intuitively to grasp the tilt direction and other details of the sample.

An object of the present invention is to provide a charged particle beam apparatus that allows the orientation and the tilted state of the sample to be grasped intuitively.

Means for Solving the Problem

In solving the problem above, the present invention adopts the structures such as those described in the appended claims.

Of multiple means included in this application to solve the above problem, one includes: a charged particle beam source that emits a charged particle beam; a charged particle beam optical system that irradiates a sample with the charged particle beam; a platform on which the sample is placed; a stage capable of moving the platform at least in a tilt direction; a display unit that displays a tilted state of the platform by use of a simulated image of the platform; an operation input unit that allows a user to designate the observation target portion of the sample and the direction in which the observation of the sample is performed; and a control unit that controls the amount of movement of the stage based on a signal input from the operation input unit.

Effect of the Invention

According to the present invention, the orientation and the tilted state of the sample can be grasped intuitively.

Objects, structures, and effects other than those described above will become apparent upon a reading of the following explanations of embodiments of this invention.

BRIEF DESCRIPTION OF THE DRAWINGS

FIG. 2 is a flowchart of processes leading up to observation of a sample.

FIG. 4-1 shows an example of how a simulated image is seen.

FIG. 4-2 shows another example of how the simulated image is seen.

FIG. 4-3 shows another example of how the simulated image is seen.

FIG. 5-1 shows an example of how a simulated image is seen, the image indicating the positional relation between a detector and a platform.

FIG. 5-2 shows another example of how the simulated image is seen, the image indicating the positional relation between the detector and the platform.

FIG. 5-3 shows an example of how a simulated image is seen, the image indicating the positional relation between an aperture and the platform.

MODE FOR CARRYING OUT THE INVENTION

Figure 1:
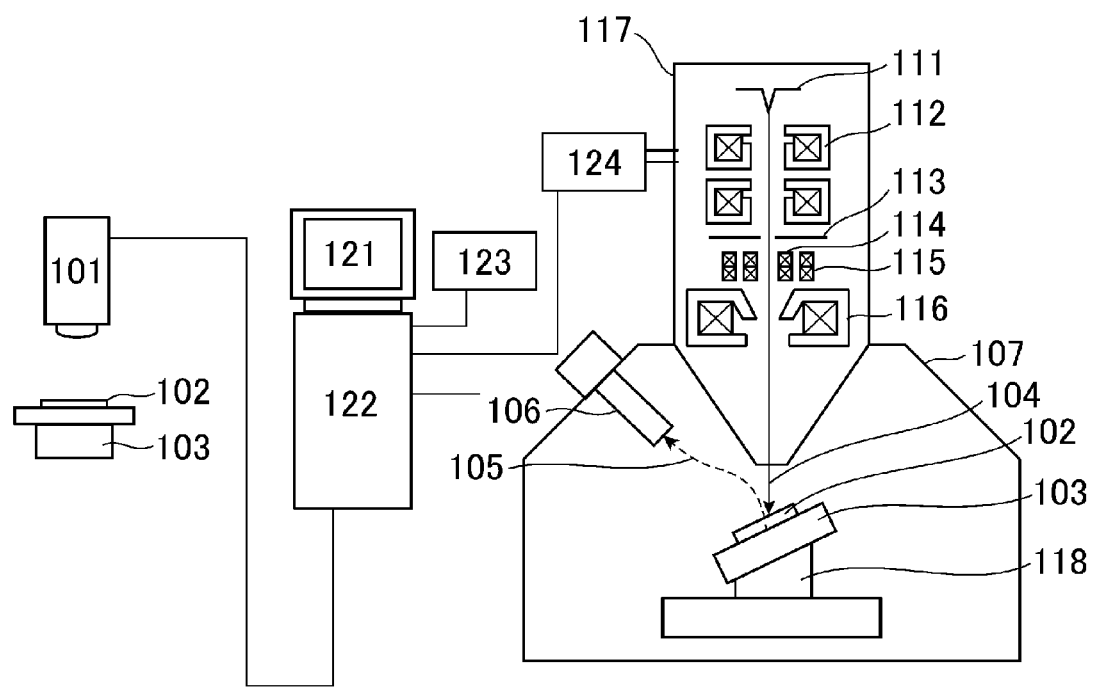
FIG. 1 is a schematic diagram showing an overall structure of a charged particle beam apparatus.

One disclosed embodiment of the present invention is a charged particle beam apparatus including: a charged particle beam source that emits a charged particle beam; a charged particle beam optical system that irradiates a sample with the charged particle beam; a platform on which the sample is placed; a stage capable of moving the platform at least in a tilt direction; a display unit that displays a tilted state of the platform by use of a simulated image of the platform; an operation input unit that allows a user to designate an observation target portion of the sample and a direction in which the observation of the sample is performed; and a control unit that controls the amount of movement of the stage based on a signal input from the operation input unit.

In another disclosed embodiment, a tilted axis is capable of being set as desired on the simulated image. In a further disclosed embodiment, the stage is capable of moving the platform in a parallel, tilted, and rotative manner, and wherein the tilted axis set on the simulated image is made to correspond to the tilted axis of the stage through combination of the parallel movements or rotative movements of the stage.

In another disclosed embodiment, the simulated image represents an overall external shape of the platform.

In another disclosed embodiment, the simulated image is used to designate the observation target portion of the sample and the direction in which the observation of the sample is performed.

In another disclosed embodiment, the charged particle beam apparatus further includes an imaging device for imaging the sample. An image obtained by the imaging device is superimposed on the simulated image of the platform when displayed.

In another disclosed embodiment, the simulated image is displayed in a manner permitting a grasp of the tilted state of the stage within a display surface of the display unit, the tilted state of the stage being relative to the direction perpendicular to the display surface.

In another disclosed embodiment, an image of at least a part of the components included in the charged particle beam optical system is displayed in conjunction with the simulated image of the platform. In another disclosed embodiment, the charged particle beam optical system includes a detector that detects secondary particles obtained from the sample irradiated with the charged particle beam. The part of the components included in the charged particle beam optical system is the detector. In another disclosed embodiment, the part of the components included in the charged particle beam optical system faces the sample.

In another disclosed embodiment, the charged particle beam apparatus further includes a vacuum pump that evacuates a path through which the charged particle beam passes from the charged particle beam source to the sample, the path being evacuated to a predetermined degree of vacuum. The control unit performs control to tilt the stage during a waiting time in which the predetermined degree of vacuum is reached.

In another disclosed embodiment, the point of view of the simulated image is arranged to be changed.

In another embodiment, the tilted and rotative movements and raster rotation of the stage are controlled on the basis of the angle of rotation of the simulated image of the platform relative to a vertical axis.

In another embodiment, a mark representing the angle of rotation of the simulated image of the platform relative to a vertical axis is displayed on the simulated image of the platform.

In another embodiment, a mark displayed on the simulated image of the platform is operated to control the angle of rotation of the simulated image relative to a vertical axis.

In another embodiment, the operation input unit is capable of moving the simulated image of the platform without moving the stage.

In another embodiment, the operation input unit includes an input means for moving the stage in such a manner that the platform reaches the state displayed on the simulated image of the platform.

In another embodiment, a warning is issued if the state of the stage does not match the state indicated by the simulated image of the platform.

In another embodiment, a warning is issued if the input information from the operation input unit does not match the state indicated by the simulated image of the platform.

In another embodiment, an observation image of the sample at a high magnification, a simulated image of the sample at a medium magnification, and a two-dimensional display of the platform at a low magnification are displayed simultaneously.

In another embodiment, a simulated beam corresponding to the observation target portion is displayed on the simulated image of the platform.

Embodiments

Some embodiments of the present invention are explained below with reference to the accompanying drawings.

The ensuing paragraphs will explain a scanning electron microscope as one example of the charged particle beam apparatus. However, the present invention is not limited to scanning electron microscopes; the invention may also be applied to scanning ion microscopes, scanning transmission electron microscope, composite equipment combining one such microscope with a sample processing device, or analysis and inspection equipment utilizing such devices. This invention can be applied to any observation device capable of tilting the sample carried thereby.

FIG. 1 is a schematic diagram of an apparatus to which one embodiment of the present invention is applied.

Before a sample is placed into a vacuum chamber 107 of the charged particle beam apparatus, a thin-section sample 102 is placed on a platform 103 by being pasted thereon. The platform 103 and the sample 102 are observed with a CCD camera 101 beforehand so that the position of observation may be verified. An imaging device other than the CCD camera may also be used as long as it can obtain images at magnifications high enough to image the entire platform. In this case, the platform 103 is mounted on a pedestal oriented in the imaging direction of the CCD camera. The pedestal is prepared in such a manner that when the platform 103 is installed, the center of the platform 103 is aligned with that of the CCD camera 101. Another pedestal of the same shape is furnished inside the vacuum chamber of the charged particle beam apparatus. This pedestal is aligned with the optical axis of the charged particle beam. After the orientation of the platform is determined under observation with the CCD camera, the entire platform is attached to the pedestal inside the vacuum chamber. This makes it possible to observe the sample with the same position of the sample taken as the center while keeping the sample oriented in the same direction between the case at which the charged particle beam apparatus is used and the case at which the CCD camera 101 is used for observation.

An electron gun 111 inside the vacuum chamber 107 generates a primary charged particle beam 104. The primary charged particle beam 104 is condensed by condenser lenses 112 before passing through a diaphragm 113. Further, the primary charged particle beam 104 is deflected by a scan deflector 114 and an image shift deflector 115. A control computer 122 allows the scan deflector 114 to control the scope, direction, and speed of scanning with the primary charged particle beam 104. Also, the primary charged particle beam 104 is focused by an objective lens 116 for irradiation of the sample 102. A detector 106 detects secondary particles 105 such as secondary and reflected electrons obtained by irradiation with the primary charged particle beam. A charged particle beam optical system 117 includes the electron gun 111, condenser lenses 113, diaphragm 113, scan deflector 114, image shift deflector 115, objective lens 116, and detector 106. Other lenses, electrodes, or detectors may be further included in the charged particle beam optical system 117. Part of the components of the charged particle beam optical system 117 may be different from those mentioned above. The charged particle beam optical system 117 may thus be configured otherwise. For example, there may be only one condenser lens 113. A vacuum pump 124 coupled to the charged particle beam optical system 117 evacuates the path through which the charged particle beam passes to a predetermined degree of vacuum. The control computer 122 provides operation control over the vacuum pump.

An image generation unit included in the control computer 122 associates a signal from the detector 106 with the position irradiated with the primary charged particle beam 104 to generate each pixel, thereby generating a charged particle image for display on a display device 121. The display device 121 is also capable of displaying the tilted state and orientation of the sample by use of a simulated image, as will be discussed later. The control computer 122 further includes a control unit that provides overall control of the apparatus such as the movement of a stage 118 and the change of magnifications. The control unit and the image generation unit may each be implemented as hardware using dedicated circuit boards or as programs to be executed by a general-purpose computer connected to the charged particle beam apparatus. These devices, circuits, and computers may be interconnected in wired or wireless fashion. Furthermore, the control computer 122 may carry out operations in addition to those described above.

The stage 118 is furnished with a mechanism for moving in crosswise (X-axis), lengthwise (Y-axis), vertical (Z-axis), rotative (R-axis), and tilted (T-axis) directions. After the platform mounted with the sample is attached to the stage, the stage may be tilted so that the portion of interest on the sample may be observed at a desired tilt angle. The embodiments described below are assumed to have at least a mechanism for movement at least in the tilt direction (T-axis).

The problems with the related art are explained below in detail.

In many cases, the charged particle beam apparatus is used basically for observation at a magnification of 10,000 times or higher. Below is an illustration of the relation between how a sample is actually seen and how the sample is seen when magnified. For example, suppose that the roof of a house in Japan is tilted at 20 degrees in the southeast direction and that the house is desired to be viewed in a flat state. A model of the Japanese archipelago may be reduced in size into a square measuring several millimeters on a side. That model may be pasted onto the platform for a magnification of 10,000 times or higher. Such a magnified view should presumably allow objects as tiny as the individual houses to be observed. When people look at a map, they generally view it with the north side up because that orientation is most familiar. The same goes with samples; people most often wish to view these objects in a predetermined direction. Some semiconductor samples are symmetrical when viewed at 90 degrees and others at 180 degrees, for example. In some cases, the sample may be totally unrecognizable if viewed in the wrong direction. Viewing an object in an unfamiliar direction often renders it difficult to recognize.

Furthermore, whereas the bearings of a map representing the entire Japanese archipelago are recognizable, a highly magnified map of Japan showing towns or several houses can be disorienting. In a localized image showing individual houses, their bearings may not be recognized. In practice, there will not be a situation where such a model of the Japanese archipelago would be observed with a charged particle beam apparatus. Still, by extension, it is difficult to associate the orientation of a sample seen with the naked eye with the orientation of the sample in an acquired image. It is thus difficult intuitively to grasp the direction of tilt and other specifics of the imaged sample.

Figures 1, 4:
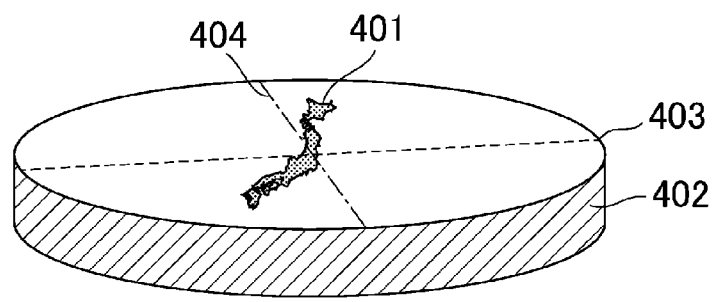

Although the above description adopted the map of Japan for purpose of explanation, the wording "map of Japan" may be replaced with an "overall map of the country" regarding any country as needed for the same purpose. In FIG. 4-1, the direction of a tilted centerline 404 may be read as the north-south direction (top of the drawing points to the north) and the direction of a tilted axis as the east-west direction (right-hand side of the drawing points to the east) on a map of a given country.

One of the reasons the above problems have been experienced is that the vacuum chamber is not transparent. Unlike optical observation devices, the charged particle beam apparatus is required generally to have its sample chamber evacuated. In an obscure vacuum chamber, it is difficult to see how the sample is set up inside.

Another reason is that the sample of interest may not be set up in the desired direction. Although there exist types of apparatus allowing the sample to be replaced form the front, many others require the sample to be replaced from the side in consideration of the workspace in front of the apparatus. On this type of apparatus, the sample is rotated by 90 degrees when set up inside the sample chamber. If the sample is to be inserted into the apparatus from the side, it is obviously necessary to allow for the 90-degree rotation in the sample chamber when the sample is oriented therein.

Another reason is the tilted axis of the sample stage. Although some apparatuses have two tilted axes for the stage, most apparatuses have only one tilted axis due to cost constraints. When the sample stage is to be tilted in a desire direction on the apparatus having only one tilted axis, the sample stage is rotated so that its tilted axis will coincide with the axis desired to be tilted before the stage is tilted. This rotating movement has the disadvantage of preventing the sample from being viewed in the desired direction. Furthermore, until the ultimate position of observation is reached and the appropriate magnification of observation is attained, adjustments need to be made a number of times at low magnifications; it is then difficult to take the sample orientation into consideration at each and every adjustment.

Another reason is that when the stage is to be tilted in the depth direction of the apparatus, the setup of the sample cannot be viewed directly. Since a detector installed on the front side of the apparatus (i.e., on the side of the opening through which the sample is replaced) would hamper the work of sample replacement, the detector is generally installed on the depth side of the apparatus (i.e., on the opposite side of the opening through which the sample is replaced). In this case, if the stage is tilted so that the depth side of the stage becomes lower than the front side of the apparatus, the backside of the sample becomes visible from the front side of the apparatus. Thus the user cannot verify visually how the sample is set up. If the CCD camera is used to image the sample sideways from the backside, the obtained image shows the setup of the sample but only as a mirror image. To grasp the orientation of the sample requires performing mirror conversion.

In the past, as described above, the correspondence between the orientation of the sample viewed with the naked eye and the sample orientation on the acquired image has been difficult to recognize. Given the difficulty in intuitively grasping the tilt direction and other details of the sample, the apparatus has been clumsy to use. It has taken an enormous amount of time to move the sample into the desired state on the apparatus.

Figures 2, 4:
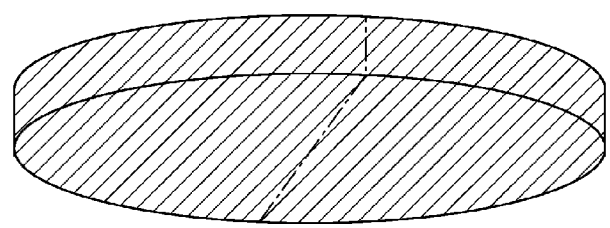
Figures 3, 4:
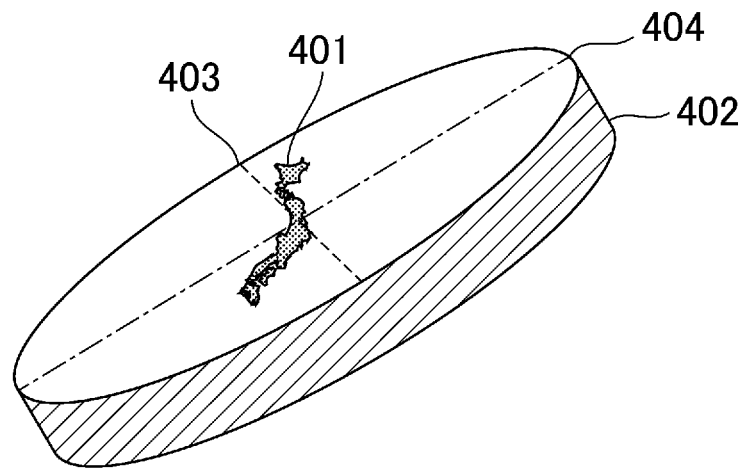

FIG. 2 shows a basic flow of processes leading up to the observation of the sample with this embodiment. First, steps 201 through 204 are explained as the process to be performed before the sample 102 is placed into the vacuum chamber 107 of the charged particle beam apparatus. The CCD camera 101 is used initially to acquire a CCD camera image of the sample (step 201). At this point, it is preferred to obtain a planar image of the entire sample.

Next, the CCD camera image is displayed three-dimensionally (step 202). Performed here is a composing process in which the CCD camera image is input to the control computer 122 before being pasted onto a virtual platform image, whereby a simulated image representing an overall external shape of the platform is generated. The simulated image, when displayed in place of the CCD camera image, allows the orientation of the sample to be grasped easily. In the above composing process, the image obtained with the CCD camera is enlarged or contracted in such a manner that the platform image will match the virtual platform image in size and that the virtual platform image will always appear in the same size on the screen. The match can also be attained through automatic image recognition because the shape and center of the platform are known beforehand and because the actual platform and the virtual platform differ only in size. Here, the three-dimensional (3D) displays are not limited to stereoscopic visions; they may also include images which are actually two-dimensional displays but which represent the tilted state three-dimensionally. Typical 3D displays are shown in FIGS. 4-1 through 4-3 and 5-1 through 5-3. In the ensuing description, the 3D display will thus refer to the mode of display permitting a grasp of the tilted state of the stage within the display surface of the display device, the tilted state of the stage being relative to the direction perpendicular to the display surface.

Figure 7:
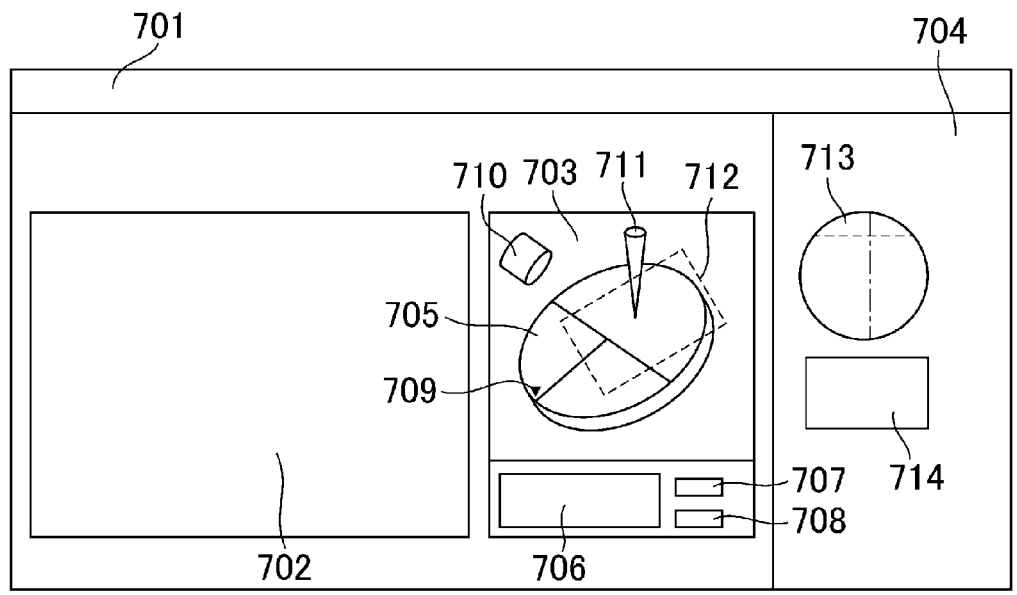
FIG. 7 shows a typical screen layout.

FIG. 7 shows a screen layout displayed when the platform is displayed three-dimensionally. On an upper side of a SEM screen 702, a menu screen 701 is displayed that permits selection of various functions. To the right of the SEM screen 701, a platform 3D display 703 representing the tilt of the platform three-dimensionally is displayed, and to the right of the platform 3D display 703, an operation panel screen 704 for operating the platform is displayed.

Under the platform 3D display 703, an input display area 706 for 3D display, a virtual movement button 707, and a stage movement button 708 are displayed. The input display area 706 for 3D display includes regions to which the position (X, Y, and Z directions), rotation angle (R direction), tilt angle (T direction), and vertical axis rotation angle (A direction) of the stage are input and which display the input values. Here, the vertical axis rotation angle (A direction) is a rotation angle relative to the axis perpendicular to an apparatus installation surface (horizontal plane) and passing through the center of a platform 705 in the platform 3D display 703 (corresponding to a vertical auxiliary line 602 in FIG. 6). After the values are input to the input display area 706 for 3D display, the virtual movement button 707 is pressed. This causes only the platform 3D display to be moved in simulated fashion (the platform is not actually moved) in accordance with the input details. On the other hand, pressing the stage movement button 708 causes the platform actually to move in keeping with the input details. The values such as the stage position (X, Y, and Z directions), stage rotation angle (R direction), and stage tilt angle (T direction) are displayed in red if they do not agree with the platform 3D display 703 and with the actual platform immediately after input, for example. If the input values agree with the platform 3D display 703 but not with the actual platform after the virtual display button 707 is pressed, for example, they are displayed in yellow. If the input values agree with both the platform 3D display 703 and the actual platform after the stage movement button 708 is pressed, for example, they are displayed in white. When the values are changed in color in this manner, it is easy to understand what these values signify. It is easy to grasp the relation among the values shown in the input display area 706 for 3D display, the platform 3D display 703, and the actual platform. In particular, it is possible to understand quickly and intuitively whether the values such as the stage position (X, Y, and Z directions) rotation angle (R direction), and tilt angle (T direction) agree with the state of the platform indicated in the platform 3D display 703 and with the actual state of the platform. Incidentally, the colors of the values may be changed as needed. It is also possible to change not only the colors but also fonts of the values, to display a mark and/or legends, or to display a suitable combination of these features. Also, the platform 705 appearing in the platform 3D display 703 may be rendered translucent, changed in color, or otherwise varied so as to warn that the platform display does not agree with the values displayed in the input display area 706 for 3D display or with the actual state of the platform. A similar warning may be issued by displaying a message on the operation panel screen 704, for example.

On the platform 705 in the platform 3D display 703, the tilted axis and tilted centerline are displayed. The tilted centerline is display only in a portion below the center of the platform 705. At the tip of the tilted centerline, a lowest position indicator 709 indicating the lowest position of the platform is displayed. This permits an intuitive grasp of the direction in which the platform is tilted, for example. When the lowest position indicator 709 is moved with a mouse or the like, the platform 3D display 703 can be rotated around the tilted axis or vertical axis. This allows even a novice operator intuitively to operate the platform without becoming aware of the tilt angle, rotation angle, and raster rotation. The values in the input display area 706 for 3D display vary with the movement of the platform 3D display 703 and, upon disagreeing with the actual state of the platform, are displayed in yellow. It is also possible to change the platform 3D display 703 directly with the mouse or the like without recourse to the lowest position indicator 709.

The platform 3D display 703 displays a detector indicator 710, a beam-irradiated position indicator 711, and a stage X-Y movement available area indicator 712. These indicators and their indicated bearings vary with the movement of the platform 3D display 703. The detector indicator 701 schematically indicates the position and direction of the detector relative to the platform 705. If multiple detectors are provided on the apparatus, multiple detector indicators 710 are displayed. In such a case, it is possible to display only the necessary detector indicator 710 by the user's operations or to display automatically only the detector indicator 710 necessary for the analysis application in effect. The beam-irradiated position indicator 711 schematically indicates the beam-irradiated position on the platform 705. It is possible to verify the position of observation on the platform 705. The stage X-Y movement available area indicator 712 schematically displays on the platform 705 the range in which the stage can be moved in the X and Y directions. It is possible to verify on the platform 705 the position that can be observed by moving the stage in the X and Y directions. The stage X-Y movement available area indicator 712 is displayed after calculating the conditions under which the platform will not come into contact with the inner walls of the sample chamber or with any detector, on the basis of the intrinsic X-Y drive range of the stage, the actual platform size, the size of the sample chamber, and the arrangement and tilt angle of the detector.

The operation panel screen 704 includes a platform 2D display 713 and an input display area 714 for 2D display. The platform 2D display 713 is similar to its counterpart of a conventional apparatus. As such, the platform 2D display 713 indicates schematically the beam-irradiated position by use of the point of intersection between lines parallel to the X-axis and Y-axis respectively. The input display area 714 for 2D display is also similar to its counterpart of the conventional apparatus. The position (X, Y, and Z directions), rotation angle (R direction), and tilt angle (T direction) of the stage can be set in this area. That is, using the operation panel screen 704 makes it possible to perform operations similar to those with the conventional apparatus.

Next, the user sets the position (X, Y, and Z directions), rotation angle (R direction), and tilt angle (T direction) of the stage while viewing the simulated image. The tilt angle and orientation of the sample stage in the simulated image are also changed in keeping with the settings (step 203). If it is arranged to set the position (X, Y, and Z directions), rotation angle (R direction), ant tilt angle (T direction) of the stage by dragging the simulated image or otherwise manipulating the state of the imaged platform in the simulated image, that will further improve the ease of use. Also, the point of view may be changed or the image may be enlarged or contracted, as will be discussed later. If the display device is a touch panel, it can be used in place of a mouse. An operation input unit 123 is the term used here generically to represent the means such as the mouse by which the user performs input for designating the state of the platform, the observation target portion, and the direction of observation.

In the prior art, the degree of tilt was input numerically by use of a keyboard. Since the actual location and the state of the resulting tilt were not seen, it was difficult to grasp how the tilt came about. For example, even if the tilt occurred on a totally different tilted axis, it was sometimes left unnoticed. When the tilt angle of the stage, the enlargement and contraction of the imaged stage, and the point of view on the image are arranged to be variable with fingertips on a tablet terminal or with a mouse device, it is possible to evaluate and grasp clearly how the stage is tilted through observation from the varying points of view. Where it is required to obtain a precise angle, the requirement can be met by numerical input through the keyboard.

Next, the sample 102 is set in the vacuum chamber 107 (step 204). At this point, the setting is made in the vacuum chamber while keeping intact the actual position (X and Y directions), rotation angle (R direction), and tilt angle (T direction) of the stage adjusted in step 203. As mentioned above, a pedestal similar in shape to the pedestal located under the CCD camera is installed inside the vacuum chamber in alignment with the optical axis of the charged particle beam optical system. Thus, simply placing the sample together with the platform 103 onto the pedestal inside the vacuum chamber sets up the sample with its position, rotation angle, and tilt angle kept intact.

Next, the process to be performed after the sample 102 is placed into the vacuum chamber 107 of the charged particle beam apparatus is explained below in conjunction with steps 205 through 209.

After the setup of the sample 102 is completed, evacuation is started (step 205). The user instructs the control computer 122 to start evacuation by pressing an evacuation OK button, for example.

It generally takes at least 10 minutes to reach a vacuum. During that time, the stage is moved (step 206) in accordance with stage information about the sample stage in the simulated image. Here, the stage information refers to the position (X and Y directions), rotation angle (R direction), and tilt angle (T direction) of the stage. When instructed to start evacuation in step 205, the control computer automatically starts step 206.

The tilt angle and orientation of the sample stage in the simulated image may differ from the actual rotation angle (R direction) and tilt angle (T direction) of the stage. For the sake of intuitive understanding, the tilt angle and orientation of the sample stage in the simulated image should preferably be set as desired by the user without being bothered with the restrictions on hardware movement. On the other hand, the actual stage is subject to the constraints on movable ranges of rotation and tilt attributable to hardware. For example, if there is only one tilted axis of the stage as mentioned above, the tilted axis cannot be set as desired under hardware restrictions. Thus the tilt angle and orientation of the sample stage adjusted by the user in the simulated image need to be converted into the actual rotating and tilting movements of the stage.

The conversion is accomplished by allowing the tilted axis set in the simulated image above to correspond to the tilted axis of the stage. Specifically, the conversion is performed as follows: first, the stage is moved in the X and Y directions so that the rotation center of the simulated image will align with that of the stage. The stage is then rotated so that the downward-tilted centerline of the simulated image along with its tilt direction will align with those of the actual stage. Thereafter, the actual stage is tilted so that its tilt angle will match that of the simulated image. At this point, the amounts of movement in the X and Y directions, the rotation angle, and tilt angle of the stage are determined by an arithmetic processing unit in the control computer 122 on the basis of the stage information input by the user. For example, conversion tables may be prepared beforehand, or the values may be converted every time they are input through calculations using conversion equations. Even if the values are calculated every time they are input, the conversion equations used for the calculations are simple so that the quantities of the calculations involved are limited.

Generally, it takes several minutes at most to move the stage into position. It might happen that upon completion of the stage movement, the predetermined degree of vacuum has yet to be reached. In that case, acquisition of the predetermined degree of vacuum is awaited. After the predetermined degree of vacuum is obtained, the process of evacuation is terminated (step 207).

If the stage were to be moved while being observed after completion of evacuation, it would take too much time to move the stage. Instead, with the stage being moved during evacuation, the stage can be set to the desired position in due course when the apparatus is readied for observation, without the user becoming aware of the process. Although the stage may not be moved exactly into the correct position for observation, the stage can be set, at a relatively high level of accuracy, to the observation position (X-Y coordinates), the correct tilt angle (T), and the desired direction (W) for observation, without any waiting time. Here, the desired direction (W) for observation refers to the direction in which the user wants to observe the sample, and corresponds to the rotation angle of the simulated image.

Next, the rotation of the image caused by stage rotation is corrected by making the scan deflector rotate the scanning direction of the primary charged particle beam by a predetermined amount through raster rotation (step 208). That is, the actual stage is tilted in keeping with the tilted axis. If the stage were to be observed with no correction, the stage would appear to be rotating arbitrarily. In order to obtain the apparently original display, the image is rotated in the opposite direction through raster rotation. Here, the amount by which to rotate the scanning direction of the primary charged particle beam is the amount by which the tilted axis of the simulated image was rotated to align with the tilted axis of the actual stage in step 206. That is, this amount of rotation is a vertical axis rotation angle (A). When the desired position to be tilted is subjected to raster rotation up to a position at which the stage is tiltable by the same angle as the rotation angle (R) in the opposite direction for rotation offset at the vertical axis rotation angle (A), the imaged sample stage can be made apparently to change solely in its lowest position without the sample stage actually rotating.

Finally, observation is started by getting the surface of the sample scanned with the primary charged particle beam (step 209). When observation is started under the above-described control, the sample is apparently seen tilted where desired and oriented in the same manner as before. Most scanning electron microscopes have their stage tilt direction fixed. In this embodiment, too, the stage can only be tilted in the depth direction as viewed from the front of the apparatus. Thus if the user designates the lowest position on the screen (i.e., on the sample), the stage is rotated at the rotation angle (R) so that the stage can be tilted in the designated direction in such a manner that the lowest position of the sample faces the backside. As a result, the lowest position of the sample can be tilted (T). However, if this state were to be observed unadjusted, the desired direction (W) for observation would be seen rotated arbitrarily by the rotation angle (R). Thus through raster rotation, the imaged sample is rotated by the same angle as the rotation angle (R) in the opposite direction, i.e., by the vertical axis rotation angle (A). This allows the desired position to be tilted and be seen in the same direction (W) as before, which is very convenient. Although the rotation angle (R) here is shown for the purpose of obtaining a tilt in any desired direction, the actual rotation angle (R) may or may not coincide with the value of the vertical axis rotation angle (A) with its sign inverted. That is because the purpose of the actual rotation angle (R) is twofold: to acquire a tilt in the desired direction, and to rotate the sample simply for observation.

In conjunction with observation, a SEM image may be displayed on the surface of the platform 705 in the platform 3D display 703. In default, the SEM image displayed in keeping with the tilt of the platform 705 is made to be smaller than the SEM screen 702 and larger than the platform 2D display 713 in magnification. It is also possible to delete the display of the platform 705 and display only the SEM image in accordance with the tilt. When a SEM image at a high magnification, a SEM image in the platform 3D display 703 at a medium magnification, and the platform 2D display 713 at a low magnification are displayed side by side, it is possible intuitively to understand the relations between the viewing conditions such as the observation position on the actual sample and its tilt angle. The magnification of the SEM image in the platform 3D display 703 may be adjusted either by the user or by the apparatus automatically based on the magnification of the SEM screen 702, for example.

Also, the way the stage is moved using the simulated image as discussed above applies not only immediately after the sample is replaced but also when the desired sample position, tilt angle, or tilted axis is changed. In such cases, the CCD camera image to be used as the simulated image may continue to use that which was acquired before the sample was introduced into the vacuum chamber. As in the example above, the user can move the stage as desired by changing the settings on the simulated image and pressing the movement buttons. In this case, the above-mentioned steps 206, 208 and 209 are carried out. Although it takes some time actually to move the stage, the operations involved may be performed intuitively, and the movement up to the desired position may be accomplished easily.

With the above structure, the stage can be moved easily whenever desired with no restrictions on the tilted angle of the stage. That is, although the hardware axis that can be tilted is fixed, the stage can be moved as if were displaced on the desired tilted axis and tilt angle. Because the tilt in the simulated image is converted automatically into actual stage control quantities, there is no need to proceed with the operations of stage movement while verifying the ongoing process. With no need to view halfway-rotated images, there is little possibility of mistakes being made. And since the sample can be seen in the desired direction selected beforehand, there is a reduced possibility of the user erroneously recognizing the direction of the sample.

Figure 3:
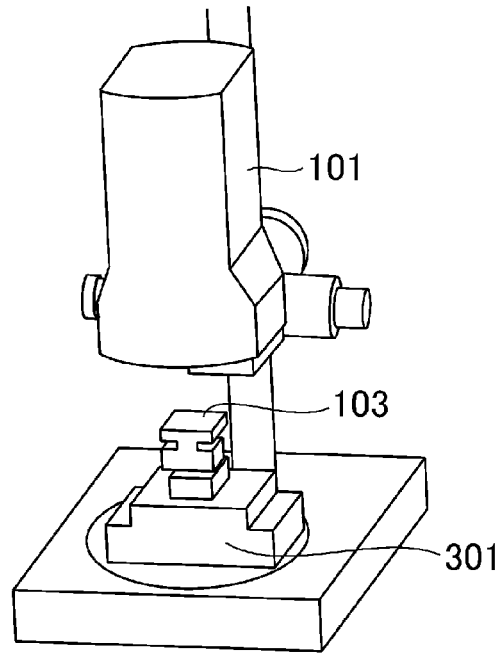
FIG. 3 is a schematic diagram of a CCD camera.

FIG. 3 is a schematic view of a CCD camera.

In a platform fixing unit 301, it is important that the platform 103 be in the same position as the center of the platform placed in the vacuum chamber 107. The image obtained with the CCD camera 101 should preferably be enlarged or contracted in magnification in accordance with the size of the platform 103. The stage is moved relative to the origin taken at the center of the unit to which the platform is fixed inside the vacuum chamber. It follows that alignment in the vacuum chamber is simplified when the center of the platform fixing unit 301 coincides with the center of the position where the platform is installed inside the vacuum chamber. A slight mismatch between the centers may occur, which is due to a difference in magnification. When an alignment is performed between the platform image and the CCD image, therefore, enabling at least either the platform frame image or the CCD image to be enlarged, contracted, or moved for correcting makes the alignment there between possible. When the platform image in the CCD camera image is aligned with the platform image in the simulated image, designating a certain position in the simulated image reveals the distance from the center of the actual platform as long as the size of the platform has been previously known. Since the position desired to be directly observed cannot be determined from an overall image of the sample, the image may be gradually enlarged to make a search for the target position. The search may be performed in the same manner as on a plane with no tilt.

FIGS. 4-1 through 4-3 represent how simulated images are seen. FIG. 4-1 shows how a simulated image with no tilt is seen. Below is an explanatory example in which a CCD camera image taken of a sample 401 as a model of the Japanese archipelago is superposed onto a platform 402 to generate a simulated image. In the ensuing description, the axis whose height remains unchanged when the platform is tilted on a hardware basis will be referred to as a tilted axis 403. In the example of FIG. 4-1, if the platform is tilted in the depth direction of the drawing (in the north-south direction of the Japanese archipelago model), then the tilted axis 403 comes about as seen in FIG. 4-1. Also when the platform is tilted in the depth direction of the drawing (in the north-south direction of the Japanese archipelago model), a straight line connecting the highest position and the lowest position of the platform is referred to as a tilted centerline 404. Obviously, the tilted axis 403 and the tilted centerline 404 intersect at right angle.

FIG. 4-2 shows how the simulated image is seen when viewed in the direction from an opening through which the sample is replaced on the actual apparatus. When the tilted sample is seen sideways from the front of the apparatus, the backside of the sample generally starts to be visible (depending on the tilt angle) because the detector is installed in the rear. When the platform is further tilted, the backside of the platform becomes visible as shown in FIG. 4-2, with the sample of interest hidden from sight. With the platform tilted and its backside coming into sight, the user cannot evaluate whether the sample is positioned or oriented as desired. Such eventualities are circumvented by having the sample seen and observed from varying points of view.

FIG. 4-3 shows an ideal manner in which the simulated image is seen. Initially, the simulated image is rotated to reach the direction in which the user wants to view the sample. Then operations are performed so as to tilt the simulated image in the direction desired by the user regardless of whether the tilt is achievable on a hardware basis. Here, it is important that the tilted axis 403 or the tilted centerline 404 on the simulated image be changed as desired in any directions including the direction of the tilted axis subject to hardware constraints and the other directions. When the stage is moved until such a vision is attained, the user can set up the tilt in an intuitive, easy-to-grasp manner.

However, the priority given to the ease of grasp by the user leaves the actual stage moving to a position different from that displayed in the simulated image. Depending on the relation between the direction of tilt and the position of the detector, the platform may have been rotated to a position not expected by the user. Meanwhile, in order to observe the tilted sample most clearly, focus correction and magnification correction per raster scan are effective. For that purpose, it is important that the direction of the tilted axis be the same as the scanning direction. The scanning direction is thus rotated for observation.

The simulated image may be switched between diverse points of view, such as when the sample is viewed from the detector, when the sample is viewed from the front of the apparatus (i.e., from the opening of the sample chamber for sample replacement), or when the sample is viewed in the direction in which the sample is observed most clearly (i.e., in the direction where the scanning direction remains constant relative to the screen on which the simulated image is displayed). Simulated images may also be displayed on two screens for comparison of the differences there between. These manners of observation facilitate a grasp of the rotation direction and the point of view upon actual observation.

For example, the advantage gained when the sample is viewed from the front of the apparatus is that the sample can be represented in the direction desired by the user and that the correspondence in orientation between the simulated image and the sample can be grasped intuitively. That is because the user usually sets up the sample in the apparatus in the desired direction in which to view the sample. It is important not to change the rotation direction of the simulated image even when the simulated image is tilted at a desired angle.

The advantage gained when the sample is viewed in the direction from the detector is that it is possible to estimate how a sample having a rough surface is seen as a SEM image. A sample with bumps and dents may appear shadowed in black when displayed. In the SEM image, the detector is located in the direction of the light source for the image. This means that the bumps cast shadows on the opposite side as viewed from the detector and that the dents appear as shadows on the side of the detector. Thus if the roughness of the sample and the direction of the detector are known beforehand, it is possible to verify how the roughness of the sample appears in the SEM image.

The advantage of the simulated image as viewed in the direction in which the sample is seen most clearly is that the actual raster scan direction can be recognized easily. The greater the tilt angle of the sample, the more difficult it is to focus on the sample because the distance between the top of the sample and the electron gun is different from the distance between the bottom of the sample and the electron gun. There are techniques for changing the focus on the sample at intervals of several raster scans in order to achieve the clearest observation. Specifically, changing the focus per raster scan is difficult because it is too rapid to perform. Instead, the sample is scanned in the direction of the tilted axis, and the focus is changed at intervals of several raster scans in the direction of the tilted centerline. Because simply changing the focus alters the magnification, it is necessary to adjust the focus and magnification so that the magnification remains unchanged in a completed image. In this manner, the scanning direction is rotated through raster rotation so as to achieve parallelism with the tilted axis direction for the clearest observation of the sample. Meanwhile, in many cases, the user observes the simulated image on the assumption that the scanning direction is always constant. If the user wishes to display the simulated image in the desired direction for observation using the SEM image, the image is to be obtained in a scanning direction different from that which is expected by the user. Thus it is preferred that the simulated image be displayed from a point of view in the direction in which the scanning direction remains constant on the simulated image, i.e., from a point of view in the direction in which the sample can be observed most clearly.

In the case of display from such a point of view, the viewpoint of the simulated image is determined by the tilted axis direction of the stage. For this reason, the simulated image is usually displayed in a direction different from the direction in which the user wishes to view the SEM image. On the other hand, as explained above in connection with step 208, what is also important is the effect that the user may not become aware of the hardware constraints on the tilted axis direction of the stage by making the scanning direction of the actual SEM image coincide with the observation direction of the simulated image through raster rotation. These points of view should preferably be switched as needed.

Figures 1, 5:
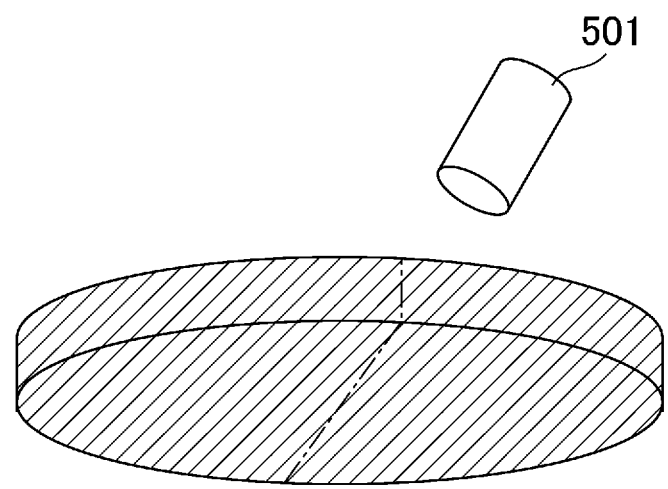
Figures 2, 5:
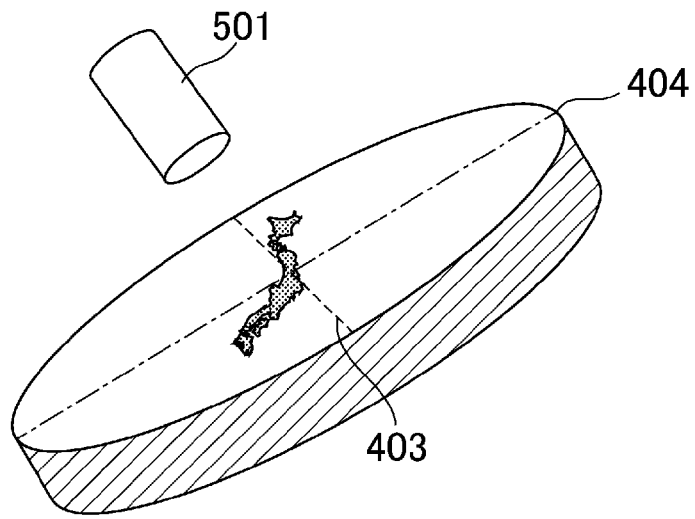
Figures 3, 5:
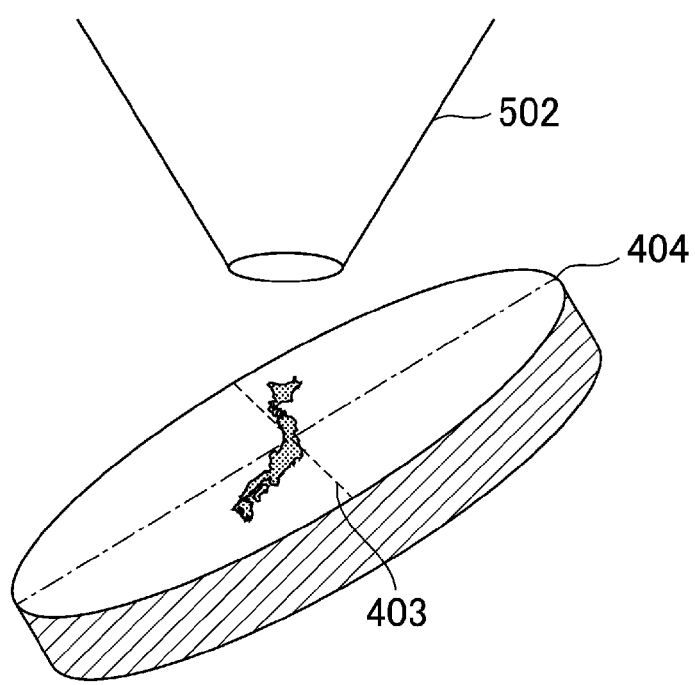

FIGS. 5-1 through 5-3 show examples of simulated images obtained from different points of view.

FIG. 5-1 shows an example in which the viewpoint of the simulated image is at the front of the apparatus. In this example, the sample is actually oriented and tilted in the direction of the detector installed on the opposite side of the apparatus front. That means the tilted state of the sample indicated in the simulated image is equal to the actual tilted state of the sample. Viewing the image from this point of view permits an intuitive grasp of the state in which the sample was introduced. However, because the backside of the sample is visible, the user cannot determine whether the amount of tilt is the desired amount.

Thus as shown in FIG. 5-2, a simulated representation of a case is made, in which the point of view is changed so that the position on the sample surface can be verified.

In FIGS. 5-1 and 5-2, a detector 501 is displayed along with the simulated image from a point of view slightly away from the ideal viewpoint in FIG. 4-3. These images are convenient because they allow the user intuitively to grasp the positional relation between the detector and the sample. When the platform is rotated on the apparatus without the user becoming aware of the rotation as discussed above, the detector 501 in its fixed position appears to rotate relative to the sample. Thus if the sample has a rough surface as mentioned above, clarifying the position of the detector 501 also makes it easier to view the state of the bumps and dents on the sample. The detector 501 may be displayed only when the point of view is moved away at least over a predetermined distance, or the direction of the detector 501 may be continuously indicated in the simulated image.

FIG. 5-3 shows an aperture 502 constituting an opening of the electron gun. Here, the aperture refers to one of the components making up the charged particle beam optical system and faces the sample, such as the tip of the objective lens. The display allows the user to verify that the aperture 502 will not come into contact with the platform 402 when the platform 402 is tilted nearly perpendicularly. This eliminates the possibility of a failure of the apparatus or a flaw on the sample caused by the contact there between, so that safety and convenience are guaranteed. Generally, the distance between the aperture 502 and the sample 401 is as small as a few millimeters so that due care must be exercised. The smaller the distance between the aperture 502 and the sample 401, the higher the magnification for the acquired image becomes available. When the small distance is thus obtained with a feeling of security, convenience is afforded.

The other components included in the charged particle beam optical system, in place of or in addition to the detector and aperture, may be displayed in conjunction with the simulated image. Also, not all but only part of the detector, aperture, and the other components included in the charged particle beam optical system may be displayed. If these components are not included in the field of vision of the simulated image, an arrow or like marks indicative of the direction of the detector or of others may be displayed superimposed on the simulated image.

The point of view may be selected by the user operating a GUI having multiple buttons displayed on the screen. The simulated image is then displayed from the selected point of view. When moving to a different point of view, the user may move the point of view of the simulated image slowly and continuously over the display. This allows the user to recognize movement of the point of view more easily, and eliminates the possibility of making mistakes in recognizing the direction of the viewing point.

In addition to the changing of the point of view by use of a device such as a mouse, it is further preferred that the field of vision and the scaling factor be changed so as to evaluate the desired position of observation as needed.

As described above, the point of view of the sample may be switched from the detector to the front of the apparatus to the back of the apparatus, for example, for observation. This eliminates the possibility of making mistakes in recognizing the direction and permits smooth observation.

Figure 6:
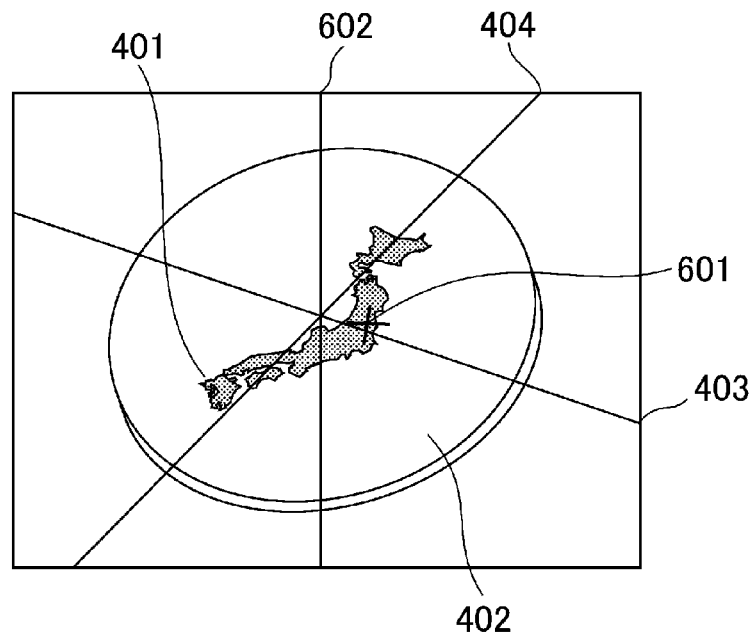
FIG. 6 shows a typical 3D display screen.

FIG. 6 is an actual 3D representation of a model of the Japanese archipelago given as an example. A cross (x) mark indicates an observation position 601. On the stage, the X- and Y-axes move so that the observation position will come immediately under the electron gun. At this point, there are two methods of representation: either the position immediately under the electron gun is made to be the center of the simulated image, or the center of the platform 402 is fixed to the center of the simulated image. According to the former method of representation, it is easy to see the observation point 601 coming immediately under the electron gun. With the latter method of representation, it is easy to see where the position to be observed is located over the entire sample. Which of the methods to use may be set beforehand on the apparatus or may be selected by the user.

Figure 8:
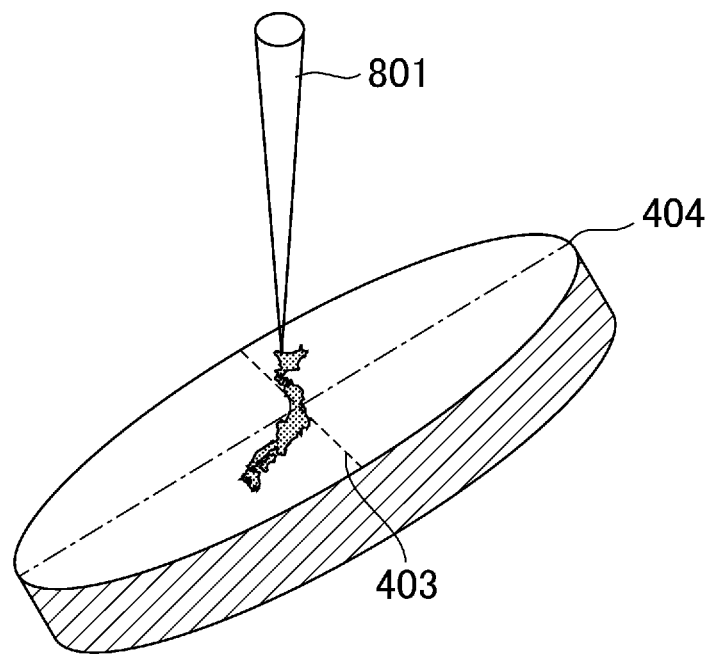
FIG. 8 shows an example of how a simulated image is seen, the image indicating the positional relation between a beam-irradiated position and the platform.

FIG. 8 shows a typical manner in which a simulated image indicating the positional relation between the beam-irradiated position and the platform is seen. This is another method of representation displaying the observation position three-dimensionally. Here, on the simulated image of the platform, a beam-irradiated position indicator 801 representing the beam with an inverted translucent cone is displayed three-dimensionally. The tip of the beam corresponds to the observation position, which is easy to grasp three-dimensionally over the platform. Because the beam is made translucent to let its rear side be seen through, the beam poses little visual impediment during observation. It is also effective to switch beam display ON/OFF. The method of representing the observation position by indicating the cross (x) mark over the platform, as shown in FIG. 6, allows the observation position to be grasped quickly and intuitively as long as the tilt of the platform is small. As the platform is tilted further so that the displayed cross (x) mark is more distorted, it may become troublesome to grasp the observation position. However, the method of representation by use of the beam-irradiated position indicator 801 as shown in FIG. 8 does not distort the display even if the platform is largely tilted. This makes it possible to grasp the observation position quickly and intuitively regardless of the tilt angle. Obviously, the cross (x) mark such as is shown in FIG. 6 and the beam-irradiated position indicator 801 as in FIG. 8 may be used at the same time. In order to have the observation position grasped more easily, the beam-irradiated position indicator 801 may be shown tilted in keeping with the changes in tilt angle or in some other factor.

Where only the platform is displayed on a screen with no background, it may presumably be difficult to see the tilt angle and orientation of the platform as the platform is tilted in a given direction. In such a case, drawing lines each parallel to the vertical auxiliary line 602, tilted centerline 604, and tilted axis 603 respectively makes it appreciably easier to grasp the tilt of the platform. These parallel lines may be displayed when the point of view is set at a distance.

The present invention is not limited to the embodiments discussed above and may also be implemented in diverse variations. The embodiments above have been explained as detailed examples helping this invention to be better understood. The present invention, when embodied, is not necessarily limited to any embodiment that includes all the structures described above. Part of the structure of one embodiment may be replaced with the structure of another embodiment. The structure of a given embodiment may be supplemented with the structure of another embodiment. Part of the structure of each embodiment may be supplemented with, emptied of, or replaced by another structure. The above-described structures, functions, processing units, and processing means may be implemented partially or entirely by hardware through integrated circuit design, for example.

Also, the above-described structures and functions may be implemented by software in the form of programs which, when interpreted and executed by a processor, bring about the respective functionality. The programs, tables, files, and other data for implementing the functions may be stored in storage devices such as memories, hard disks and SSD (Slid State Drive), or on recording media such as IC cards, SD cards and DVDs. The illustrated control lines and data lines may not represent all control lines and data lines needed in the apparatus as a product. In practice, almost all structures may be considered to be interconnected.

DESCRIPTION OF REFERENCE CHARACTERS

101 CCD camera
102, 401 Sample
103, 402, 705 Platform
104 Primary charged particle beam
105 Secondary particles
106, 501, 710 Detector
107 Vacuum chamber
111 Electron gun
112 Condenser lens 113 Diaphragm
114 Scan deflector
115 Image shift deflector
116 Objective lens
117 Charged particle beam optical system
118 Stage
121 Display device
122 Control computer
301 Platform fixing unit
403 Tilted axis
404 Tilted centerline
502 Aperture
601 Observation position
602 Vertical auxiliary line
701 Menu screen
702 SEM screen
703 Platform 3D display
704 Operation panel screen
706 Input display area for 3D display
707 Virtual movement button
708 Stage movement button
709 Lowest position indicator
711, 801 Beam-irradiated position indicator
712 Stage X-Y movement available area indicator
713 Platform 2D display
714 Input display area for 2D display

The invention claimed is:

1. A charged particle beam apparatus comprising:
a charged particle beam source that emits a charged particle beam;
a charged particle beam optical system that irradiates a sample with the charged particle beam;
a platform on which the sample is placed;
a stage capable of moving the platform in a parallel, tilted, and rotation manner, the stage having a tilted axis;
a display unit that displays an observation image of the sample, a simulated image of the platform to represent a tilted state and an observation target portion of the platform, and a two-dimensional display of the platform;
an operation input unit capable for desirably setting the tilted axis and a tilted angle on the simulated image; and
a control unit for matching the tilted axis of the stage with the tilted axis of the simulation image by moving the platform in a parallel and rotation manner of the stage based on signals inputted from the operation input unit, the control unit matching a tilted angle of the stage with a tilted angle of the simulated image, the control unit executing raster rotation of the stage in a reverse direction with the rotation angle executed for matching the tilted axis of the stage with the tilted axis of the simulated image, so that only a direction of a center line of tilting of the platform is changed on the observation image without the stage actually rotating,
wherein a warning is issued if a state of the stage does not match a state indicated by the simulated image of the platform.

2. A charged particle beam apparatus comprising:
a charged particle beam source that emits a charged particle beam;
a charged particle beam optical system that irradiates a sample with the charged particle beam;
a platform on which the sample is placed;
a stage capable of moving the platform in a parallel, tilted, and rotation manner, the stage having a tilted axis;
a display unit that displays an observation image of the sample, a simulated image of the platform to represent a tilted state and an observation target portion of the platform, and a two-dimensional display of the platform;
an operation input unit capable for desirably setting the tilted axis and a tilted angle on the simulated image; and
a control unit for matching the tilted axis of the stage with the tilted axis of the simulation image by moving the platform in a parallel and rotation manner of the stage based on signals inputted from the operation input unit, the control unit matching a tilted angle of the stage with a tilted angle of the simulated image, the control unit executing raster rotation of the stage in a reverse direction with the rotation angle executed for matching the tilted axis of the stage with the tilted axis of the simulated image, so that only a direction of a center line of tilting of the platform is changed on the observation image without the stage actually rotating,
wherein a warning is issued if inputted information from the operation input unit does not match a state indicated by the simulated image of the platform.

3. The charged particle beam apparatus according to claim 1 or 2,
wherein the simulated image represents an SEM image on a surface of the platform.

4. The charged particle beam apparatus according to claim 1 or 2,
wherein the simulated image is an image of a CCD camera on a surface of the platform.

5. The charged particle beam apparatus according to claim 1 or 2,
wherein the simulated image represents an overall external shape of the platform.

6. The charged particle beam apparatus according to claim 1 or 2,
wherein the simulated image is used to designate the observation target portion of the sample and the direction in which the observation of the sample is performed.

7. The charged particle beam apparatus according to claim 1 or 2, further comprising:
an imaging device for imaging the sample;
wherein an image obtained by the imaging device is superimposed on the simulated image of the platform when displayed.

8. The charged particle beam apparatus according to claim 1 or 2,
wherein the simulated image is displayed in a manner permitting a grasp of the tilted state of the stage within a display surface of the display unit, the tilted state of the stage being relative to the direction perpendicular to the display surface.

9. The charged particle beam apparatus according to claim 1 or 2,
wherein an image of at least a part of the components included in the charged particle beam optical system is displayed in conjunction with the simulated image of the platform.

10. The charged particle beam apparatus according to claim 9,
wherein the charged particle beam optical system includes a detector that detects secondary particles obtained from the sample irradiated with the charged particle beam; and
wherein the part of the components included in the charged particle beam optical system is the detector.

11. The charged particle beam apparatus according to claim 9,
wherein the part of the components included in the charged particle beam optical system faces the sample.

12. The charged particle beam apparatus according to claim 1 or 2, further comprising:
   a vacuum pump that evacuates a path through which the charged particle beam passes from the charged particle beam source to the sample, the path being evacuated to a predetermined degree of vacuum;
   wherein the control unit performs control to tilt the stage during a waiting time in which the predetermined degree of vacuum is reached.

13. The charged particle beam apparatus according to claim 1 or 2,
   wherein the point of view of the simulated image is arranged to be changed.

14. The charged particle beam apparatus according to claim 1 or 2,
   wherein a mark representing the angle of rotation of the simulated image of the platform relative to a vertical axis is displayed on the simulated image of the platform.

15. The charged particle beam apparatus according to claim 1 or 2,
   wherein the mark displayed on the simulated image of the platform is operated to control the angle of rotation of the simulated image relative to a vertical axis.

16. The charged particle beam apparatus according to claim 1 or 2,
   wherein the operation input unit is capable of moving the simulated image of the platform without moving the stage.

17. The charged particle beam apparatus according to claim 1 or 2,
   wherein the operation input unit includes an input means for moving the stage in such a manner that the platform reaches the state displayed on the simulated image of the platform.

18. The charged particle beam apparatus according to claim 1 or 2,
   wherein a warning is issued if the state of the stage does not match the state indicated by the simulated image of the platform.

19. The charged particle beam apparatus according to claim 1 or 2,
   wherein a warning is issued if the input information from the operation input unit does not match the state indicated by the simulated image of the platform.

\* \* \* \* \*